United States Patent
Chern et al.

(10) Patent No.: US 9,645,408 B2
(45) Date of Patent: May 9, 2017

(54) SURFACE MOUNT DEVICE TYPE LASER MODULE

(71) Applicant: EVERREADY PRECISION IND. CORP., Kaohsiung (TW)

(72) Inventors: Jyh-Long Chern, Taipei (TW); Chih-Ming Yen, New Taipei (TW)

(73) Assignee: Everready Precision Ind. Corp., Kaohsiung (TW)

( * ) Notice: Subject to any disclaimer, the term of this patent is extended or adjusted under 35 U.S.C. 154(b) by 165 days.

(21) Appl. No.: 14/595,775

(22) Filed: Jan. 13, 2015

(65) Prior Publication Data

US 2016/0123561 A1 May 5, 2016

(30) Foreign Application Priority Data

Oct. 31, 2014 (TW) .............................. 103137854 A
Oct. 31, 2014 (TW) .............................. 103219363 U (51) Int. Cl.
| | |
|---|---|
| *F21V 9/00* | (2015.01) |
| *G02B 27/42* | (2006.01) |
| *G02B 27/48* | (2006.01) |
| *G02B 19/00* | (2006.01) |
| *H01S 5/022* | (2006.01) |
| *H01S 5/0683* | (2006.01) |

(52) U.S. Cl.
CPC ....... *G02B 27/425* (2013.01); *G02B 19/0052* (2013.01); *G02B 27/48* (2013.01); *H01S 5/02216* (2013.01); *H01S 5/02292* (2013.01); *H01S 5/02296* (2013.01); *H01S 5/0683* (2013.01)

(58) Field of Classification Search
CPC .............................. F21V 5/043; H04N 9/3161
USPC ......................................................... 362/230
See application file for complete search history.

(56) References Cited

U.S. PATENT DOCUMENTS

| | | | | |
|---|---|---|---|---|
| 2007/0047609 A1* | 3/2007 | Francis | ................. | H01S 5/0014 372/50.21 |
| 2007/0063125 A1* | 3/2007 | Downing, Jr. | ............ | G01J 1/02 250/205 |
| 2007/0153279 A1* | 7/2007 | Aasmul | ..................... | G01J 1/04 356/417 |
| 2011/0063871 A1* | 3/2011 | Tanaka | ................. | G02B 6/4204 362/553 |
| 2015/0124225 A1* | 5/2015 | Akiyama | ........... | G02B 19/0057 353/31 |

* cited by examiner

*Primary Examiner* — Anh Mai
*Assistant Examiner* — Matthew Peerce
(74) *Attorney, Agent, or Firm* — Muncy, Geissler, Olds & Lowe, P.C.

(57) ABSTRACT

A surface mount device type laser module includes a housing, an edge-emitting type laser diode unit, a reflective optical component and a base. The base is accommodated within the housing, and the edge-emitting type laser diode unit is integrated into the base. The base includes at least one surface transmission structure. The at least one surface transmission structure is exposed outside the base and the housing. An electronic signal is transmitted through the at least one surface transmission structure. A laser beam provided by the edge-emitting type laser diode unit is reflected by the reflective optical component, and the reflected laser beam is transmitted through an opening of the housing.

15 Claims, 5 Drawing Sheets

SURFACE MOUNT DEVICE TYPE LASER MODULE

FIELD OF THE INVENTION

The present invention relates to a laser module, and more particularly to a surface mount device type laser module.

BACKGROUND OF THE INVENTION

Figure 1:
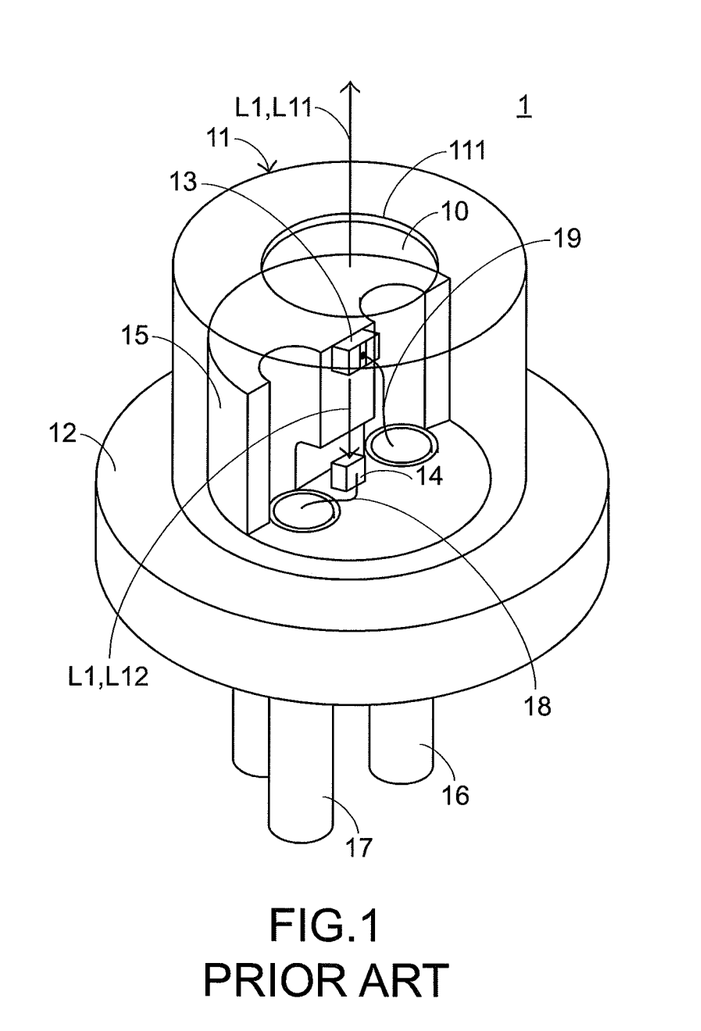
FIG. 1 is a schematic perspective view illustrating a portion of the structure of a conventional laser module.

FIG. 1 is a schematic perspective view illustrating a portion of the structure of a conventional laser module. The conventional laser module 1 has a TO-CAN package structure. Moreover, the conventional laser module 1 comprises a casing 11, a base 12, a laser diode 13, a photodiode 14, a heat sink 15, a first pin 16 and a second pin 17. The heat sink 15 and the photodiode 14 are fixed on the base 12. The laser diode 13 is disposed on the heat sink 15. The laser diode 13 and the photodiode 14 are connected with the first pin 16 and the second pin 17 through wires 18 and 19, respectively. The first pin 16 and the second pin 17 are penetrated downwardly through the base 12 and protruded outside. After the first pin 16 and the second pin 17 are penetrated through perforations of an external circuit board (not shown) and welded on the circuit board, electronic signals can be transmitted between the laser module 1 and the circuit board.

Moreover, the casing 11 is disposed on the base 12. The laser diode 13, the photodiode 14 and the heat sink 15 are covered by the casing 11. The casing 11 has an opening 111. A collimator lens 10 is disposed in the opening 111. After the laser diode 13 receives electric power through the first pin 16, the laser diode 13 provides a laser beam L1. The greater portion L11 of the laser beam L1 is propagated in the direction toward the opening 111 of the casing 11, transmitted through the collimator lens 10, and projected out. The smaller portion L12 of the laser beam L1 is projected on the photodiode 14 and optically detected by the photodiode 14. During the detecting process, the photodiode 14 generates detecting signals. These detecting signals are transmitted to the external circuitry through the second pin 17. According to the detecting signals, the subsequent controlling processes will be performed.

Moreover, for welding the laser module 1 on the circuit board, the laser module 1 should be additionally equipped with the first pin 16 and the second pin 17. The first pin 16 and the second pin 17 have to be penetrated through the circuit board. Generally, the sizes of these pins need to be greater than a lowest limit. If these pins are smaller than the lowest limit, the pins are readily broken in response to an external force. Since the package structure of the laser module 1 cannot be effectively minimized, the applications of the laser module 1 on a handheld device, a wearable device or any other small-sized electronic device will be reduced.

Moreover, when the optical element (e.g. the collimator lens 10) is integrated into the conventional laser module 1, the structure of the optical element occupies a large space. Consequently, the structure of the optical element is also detrimental to miniaturization of the conventional laser module 1. Moreover, the conventional laser module 1 is usually equipped with a single light source. Consequently, the conventional laser module 1 cannot comply with the requirements of plural light sources or plural wavelengths of the modern electronic device. Under this circumstance, the development of the handheld device, the wearable device or the comparable electronic device is restricted. In other words, the conventional laser module 1 needs to be further improved.

SUMMARY OF THE INVENTION

An object of the present invention provides a surface mount device type laser module (also referred as a SMD laser module), so that the overall volume of the electronic device with the surface mount device type laser module is reduced. Moreover, a reflective optical component is installed within a housing of the laser module to change a transmission path of a laser beam from an edge-emitting type laser diode unit. Consequently, the thickness of the surface mount device type laser module is effectively reduced, and the surface mount device type laser module is suitably applied to a handheld device, a wearable device or any other small-sized electronic device.

Another object of the present invention provides a surface mount device type laser module with a diffractive optical element in order to achieve the laser diffraction projection efficacy. Moreover, the laser module may comprise plural edge-emitting type laser diode units. Consequently, the laser module can comply with the requirements of plural light sources or plural wavelengths of the modern electronic device. Under this circumstance, the development of the handheld device, the wearable device or the comparable electronic device is accelerated.

In accordance with an aspect of the present invention, there is provided a surface mount device type laser module. The surface mount device type laser module includes a housing, a base, an edge-emitting type laser diode unit and a reflective optical component. The housing has an opening. The base is accommodated within the housing and includes at least one surface transmission structure. The at least one surface transmission structure is exposed outside the base and the housing. Moreover, at least one electronic signal is transmitted through the at least one surface transmission structure. The edge-emitting type laser diode unit is fixed on the base and providing at least one laser beam. After a first portion of the at least one laser beam is projected on the reflective optical component, the first portion of the at least one laser beam is reflected by the reflective optical component and transmitted through the opening of the housing.

In an embodiment, the surface mount device type laser module further includes a photodiode unit. The photodiode unit is disposed on the base or disposed outside the base. Moreover, at least a portion of the at least one laser beam is projected on the photodiode unit so as to be detected by the photodiode unit.

In an embodiment, the photodiode unit is disposed on the base, and the edge-emitting type laser diode unit is arranged between the reflective optical component and the photodiode unit. Moreover, a second portion of the at least one laser beam is projected on the photodiode unit.

In an embodiment, the photodiode unit is disposed outside the base, and the surface mount device type laser module further includes an optical guide element. The at least a portion of the at least one laser beam is guided by the optical guide element and projected on the photodiode unit.

In an embodiment, the surface mount device type laser module further includes at least one optical element. The edge-emitting type laser diode unit is arranged between the base and the at least one optical element. After the first portion of the at least one laser beam is reflected by the reflective optical component, the first portion of the at least one laser beam is optically processed by the at least one optical element.

In an embodiment, a center laser beam of the first portion of the at least one laser beam is emitted from a center position of a lighting zone of the edge-emitting type laser diode unit. After the center laser beam is projected on the reflective mirror, the center laser beam is reflected vertically and propagated in a direction toward an optical center of the at least one optical element.

In an embodiment, the at least one optical element includes a collimator optical element. After the first portion of the at least one laser beam is reflected by the reflective optical component, the first portion of the at least one laser beam is collimated by the collimator optical element.

In an embodiment, the at least one optical element further comprises a diffractive optical element. After the first portion of the at least one laser beam is transmitted through the collimator optical element, the first portion of the at least one laser beam is shaped by the diffractive optical element and projected out.

In an embodiment, a distance between a first optical axis of the collimator optical element and a second optical axis of the diffractive optical element is smaller than 0.2 mm.

In an embodiment, an angle between a first optical axis of the collimator optical element and a second optical axis of the diffractive optical element is smaller than 2.5 degrees.

In an embodiment, the collimator optical element and the diffractive optical element are integrated as a single optical structure.

In an embodiment, the collimator optical element has an effective focal length f, wherein 0.5 mm<f<3 mm.

In an embodiment, the collimator optical element has a numerical aperture N.A., wherein N.A.<0.6.

In an embodiment, the reflective optical component includes a reflective mirror, and the reflective mirror has an aspheric surface.

In an embodiment, the aspheric surface is a biconic surface, wherein a shape of a laser speckle outputted from the surface mount device type laser module is corrected by the aspheric surface.

In an embodiment, after the first portion of the at least one laser beam is reflected by the biconic surface, the first portion of the at least one laser beam is directed to the collimator optical element at an error angle smaller than 2 degrees with respect to a first optical axis of the collimator optical element.

In an embodiment, the at least one optical element is coated with an anti-reflection coating.

In an embodiment, the at least one surface transmission structure comprises at least one contact pad or at least one pin.

In an embodiment, the surface mount device type laser module further includes a second edge-emitting type laser diode unit and a second reflective optical component. The edge-emitting type laser diode unit and the second edge-emitting type laser diode unit provide the at least one laser beam. After the at least one laser beam is reflected by at least one of the reflective optical component and the second reflective optical component, the reflected laser beam is transmitted through the opening of the housing.

In an embodiment, the edge-emitting type laser diode unit comprises plural laser diode chips, wherein the plural laser diode chips provide plural laser beams.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 2:
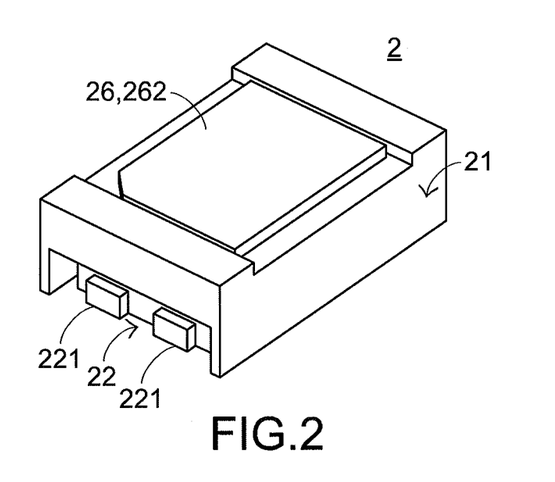
FIG. 2 is a schematic perspective view illustrating the outer appearance of a surface mount device type laser module according to a first embodiment of the present invention.
Figure 3:
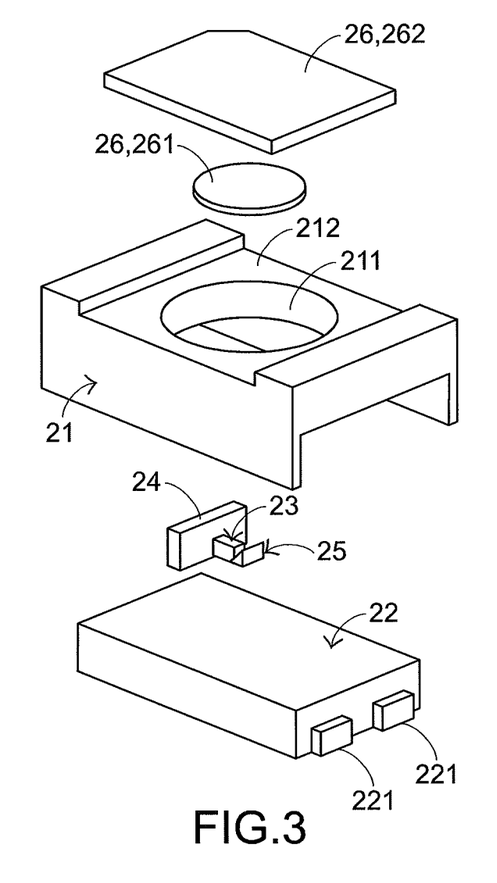
FIG. 3 is a schematic exploded view illustrating the surface mount device type laser module of FIG. 2.
Figure 4:
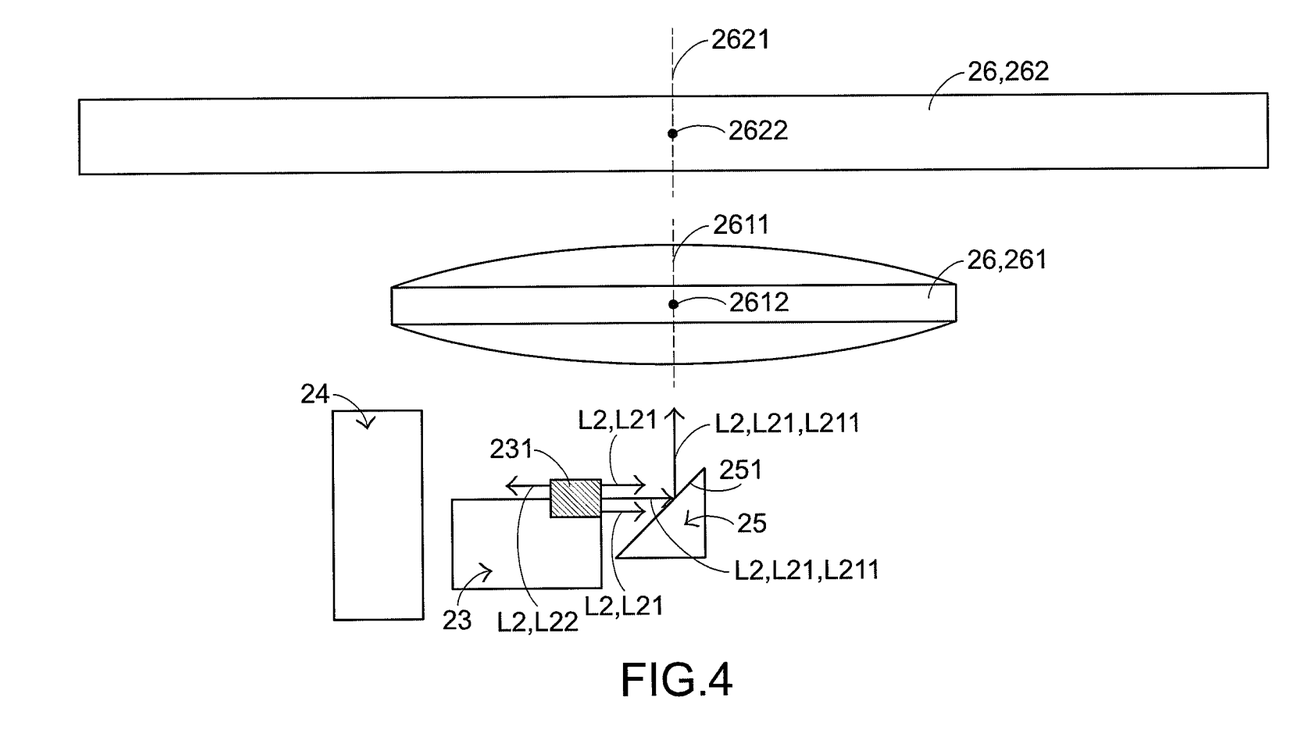
FIG. 4 is a schematic front view illustrating a portion of the surface mount device type laser module of FIG. 2.

Please refer to FIGS. 2-4. FIG. 2 is a schematic perspective view illustrating the outer appearance of a surface mount device type laser module according to a first embodiment of the present invention. FIG. 3 is a schematic exploded view illustrating the surface mount device type laser module of FIG. 2. FIG. 4 is a schematic front view illustrating a portion of the surface mount device type laser module of FIG. 2. The surface mount device type laser module 2 comprises a housing 21, a base 22, an edge-emitting type laser diode unit (LD) 23, a photodiode unit (PD) 24, a reflective optical component 25 and plural optical elements 26. The base 22 is accommodated within the housing 21. The base 22 may support one or more edge-emitting type laser diode units 23, the photodiode unit 24 and the reflective optical component 25. Moreover, the base 22 may provide a flat surface or a recess with a bottom surface in order to fix the one or more edge-emitting type laser diode units 23, the photodiode unit 24 and the reflective optical component 25. The base 22 comprises plural surface transmission structures 221. The plural surface transmission structures 221 are exposed outside the base 22 and the housing 21. The thickness of the surface transmission structure 221 is much smaller than the thickness of the base 22 and the thickness of the housing 21. The plural surface transmission structures 221 may be welded on a circuit board (not shown) through solder paste. Consequently, the electronic signals from the surface mount device type laser module 2 may be transmitted to the circuit board through the surface transmission structures 221, and the electronic signals from the circuit board may be transmitted to the surface mount device type laser module 2 through the surface transmission structures 221. The examples of the surface transmission structures 221 include but are not limited to contact pads or pins. As mentioned above, the reflective optical component 25 is fixed on the base 22. Alternatively, in another embodiment, the reflective optical component 25 may be fixed on a proper position of the housing 21. In this embodiment, the reflective optical component 25 may comprise a reflective mirror and a fixing mechanism for fixing the reflective mirror or further comprise an adjusting mechanism for adjusting an angle of the reflective mirror. The reflective optical component 25 as shown in the drawings is presented herein for purpose of illustration and description only. In practice, all of the reflective mirror, the fixing mechanism and the adjusting mechanism may be fixed on the base 22 or the housing 21, or the reflective mirror, the fixing mechanism and the adjusting mechanism may be separately fixed on different positions. Moreover, in the above drawings, the base 22 has a rectangular shape. It is noted that the shape of the base 22 may be varied according to the practical requirements.

The housing 21 and/or the substrate 22 may be used for dissipating heat. The housing 21 has an opening 211. In this embodiment, the opening 211 has a circular shape. It is noted that the shape and the size of the opening 211 are not restricted to those shown in the drawings. A laser beam inside the opaque housing 21 may be transmitted through the opening 211 and projected out. Moreover, the plural optical elements 26 are disposed in the opening 211 or arranged near the opening 211. The edge-emitting type laser diode unit 23 comprises a laser diode chip 231. The edge-emitting type laser diode unit 23 is arranged between the reflective optical component 25 and the photodiode unit 24 in the horizontal direction, and the edge-emitting type laser diode unit 23 is arranged between the base 22 and the plural optical elements 26 in the vertical direction. After the edge-emitting type laser diode unit 23 receive electric power (for example through the surface transmission structures 221), the edge-emitting type laser diode unit 23 may provide plural laser beams L2. A first-portion (i.e. the main-portion) laser beam L21 of the plural laser beams L2 is propagated in the direction toward the reflective optical component 25. After the first-portion laser beam L21 is projected on the reflective optical component 25, the first-portion laser beam L21 is reflected by the reflective optical component 25 and propagated in the direction toward the opening 211 of the housing 21. After the first-portion laser beam L21 is optically processed by the plural optical elements 26, the processed laser beam is projected out. Moreover, a second-portion (i.e. the minor-portion) laser beam L22 of the plural laser beams L2 is propagated in the direction toward the photodiode unit 24, so that the second-portion laser beam L22 is optically detected by the photodiode unit 24. During the detecting process, the photodiode unit 24 generates detecting signals. These detecting signals are transmitted to the external circuitry through the surface transmission structures 221. According to the detecting signals, the subsequent controlling processes will be performed.

In this embodiment, the plural optical elements 26 comprise a collimator optical element 261 and a diffractive optical element (DOE) 262. The collimator optical element 261 is fixed in the opening 211 of the housing 21. The diffractive optical element 262 is disposed over the collimator optical element 261 and fixed in a concave structure 212 of the housing 21. After the first-portion laser beam L21 is reflected by the reflective optical component 25, the first-portion laser beam L21 is collimated by the collimator optical element 261. After the first-portion laser beam L21 is transmitted through the collimator optical element 261, the first-portion laser beam L21 is introduced into the diffractive optical element 262 at a preferable incident angle. Consequently, the first-portion laser beam L21 through the collimator optical element 261 is shaped by the diffractive optical element 262 and shaped laser beam is projected out. Generally, by designing the texture of the diffractive optical element 262, the surface mount device type laser module 2 can be used as a generator for generating specified textured light and achieving the laser diffraction projection efficacy. The examples of the diffractive optical element are well known to those skilled in the art, and are not redundantly described herein.

Preferably, for increasing the light transmittance, the collimator optical element 261 and/or the diffractive optical element 262 may be coated with anti-reflection coatings. In addition, the effective focal length (f) and the numerical aperture (N.A.) of the collimator optical element 261 comply with the following relationships: 0.5 mm<f<3 mm and N.A.<0.6. The relationships are not restricted.

Moreover, the reflective optical component 25 at least comprises a reflective mirror 251. The reflective mirror 251 has an aspheric surface such as a biconic surface. Consequently, an error angle between the reflected first-portion laser beam L21 and an optical axis 2611 (or a first optical axis) of the collimator optical element 261 is smaller than 2 degrees. Moreover, the aspheric surface has the function of correcting the shape of the laser speckle that is outputted from the surface mount device type laser module 2. More preferably, a center laser beam L211 of the first-portion laser beam L21 is emitted from a center position of a lighting zone of the edge-emitting type laser diode unit 23. After the center laser beam L211 is projected on the reflective mirror 251, the center laser beam L211 is reflected upwardly and vertically and propagated in the direction toward the optical centers 2612 and 2622 of these optical elements 26. Generally, the laser beam passing through the optical center does not suffer from any deviation. Moreover, due to the optical error of the reflective optical component 25, the center laser beam L211 is possibly unable to be vertically reflected. For solving this problem, the deviation amount between the optical axis 2611 of the collimator optical element 261 and the optical axis 2621 (or a second optical axis) of the diffractive optical element 262 is smaller than 0.2 mm, and the angle between the optical axis 2611 of the collimator optical element 261 and the optical axis 2621 of the diffractive optical element 262 is smaller than 2.5 degrees.

In another embodiment, the collimator optical element 261 and the diffractive optical element 262 are integrated as a single optical structure. Optionally, a plate (not shown) is arranged between the collimator optical element 261 and the diffractive optical element 262. Moreover, for reducing the integration error between the collimator optical element 261 and the diffractive optical element 262, the material of the plate is different from the materials of the collimator optical element 261 and the diffractive optical element 262. Consequently, the transmitting direction of the first-portion laser beam L21 is corrected and the light transmittance is enhanced.

In the above embodiment, the laser diode chip 231 of the edge-emitting type laser diode unit 23 is in parallel with the base 22. Consequently, the first-portion laser beam L21 provided by the laser diode chip 231 is propagated to the reflective optical component 25 in a substantially horizontal direction, and the first-portion laser beam L21 reflected by the reflective optical component 25 is propagated in a substantially vertical direction and projected out through the opening 211 of the housing 21. Under this circumstance, the thickness of the laser module 2 can be effectively reduced. Moreover, since the laser module 2 is a surface mount device type (SMD) laser module, the overall volume is effectively reduced. Consequently, the laser module 2 is suitably applied to a handheld device, a wearable device or any other small-sized electronic device.

Figure 5:
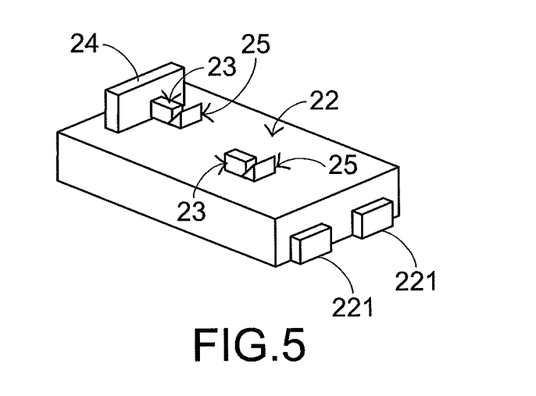
FIG. 5 is a schematic perspective view illustrating the outer appearance of a portion of a surface mount device type laser module according to a second embodiment of the present invention.

It is noted that numerous modifications and alterations may be made while retaining the teachings of the invention. For example, in a variant example, the reflective optical component 25 is not fixed on the base 22 (e.g. fixed at a proper position within the housing 21). In the above embodiment, the surface mount device type laser module only comprises a single edge-emitting type laser diode unit 23 and a single reflective optical component 25. In a variant example, as shown in FIG. 5, the surface mount device type laser module comprises plural edge-emitting type laser diode units 23 and plural reflective optical components 25, which are disposed on proper positions of the base 22. The plural edge-emitting type laser diode units 23 and the plural reflective optical components 25 may cooperate with the same photodiode unit 24. After the laser beam from the laser diode chip of each edge-emitting type laser diode unit 23 is reflected by the corresponding reflective optical component 25, the reflected laser beam is transmitted through the opening 211 of the housing 21 and projected out. Moreover, in case that a single edge-emitting type laser diode unit 23 comprises plural laser diode chips 231, the object of the present invention is achievable by using the similar approach.

Figure 6:
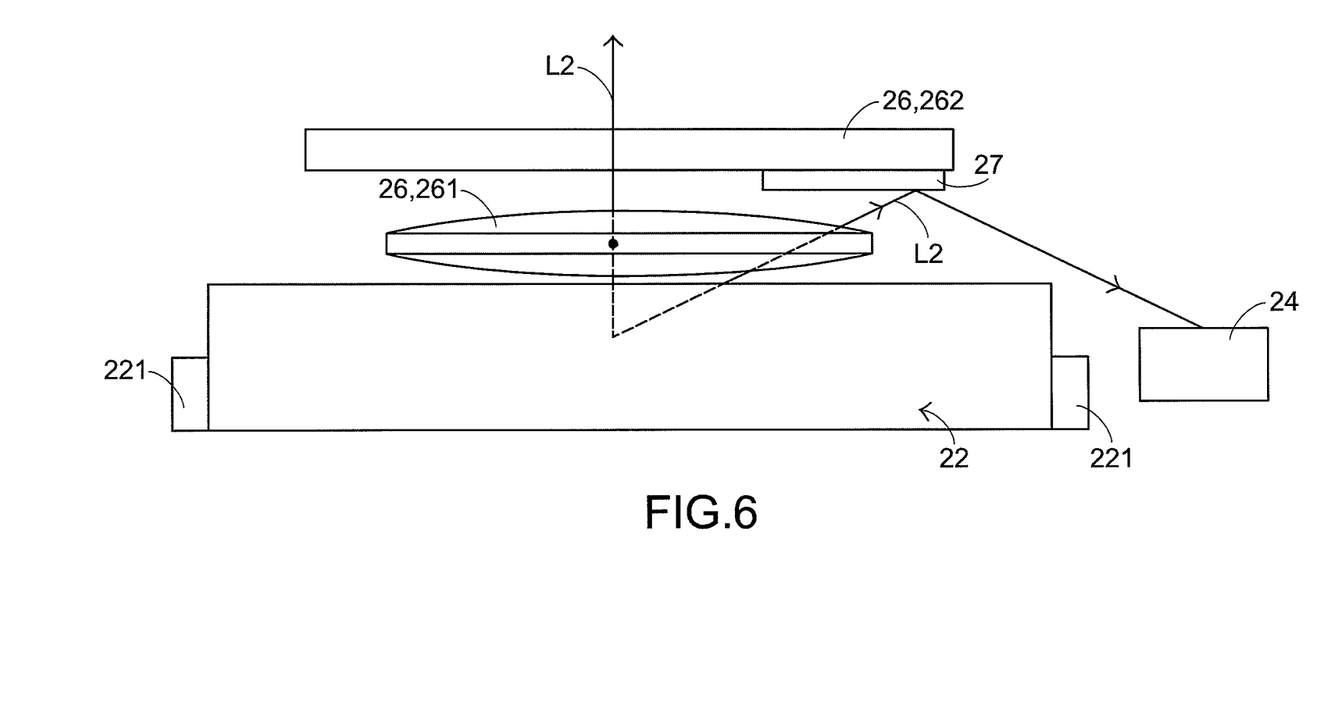
FIG. 6 is a schematic front view illustrating a portion of a surface mount device type laser module according to a third embodiment of the present invention.

In the above embodiment, the photodiode unit 24 of the surface mount device type laser module is disposed on the base 22. In a variant example, as shown in FIG. 6, the photodiode unit 24 is disposed outside the base 22. In addition, the surface mount device type laser module further comprises an optical guide element 27. After the laser beam L2 is projected on the optical guide element 27, the laser beam L2 is guided by the optical guide element 27 and propagated in the direction toward the photodiode unit 24, so that the laser beam L2 is optically detected by the photodiode unit 24. An example the photodiode unit 24 includes but is not limited to a planar photodiode unit or a dome type photodiode unit. An example of the optical guide element 27 includes but is not limited to a reflective element, a diffractive element or a diffractive element, which is formed by applying a coating or forming a film.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A surface mount device type laser module, comprising:
   a housing having an opening;
   a base accommodated within the housing and comprising at least one surface transmission structure, wherein the at least one surface transmission structure is a contact pad which is exposed outside the base and the housing, and at least one electronic signal is transmitted through the at least one surface transmission structure;
   an edge-emitting type laser diode unit fixed on the base and providing at least one laser beam; and
   a reflective optical component;
   a photodiode unit disposed on or outside the base, wherein the edge-emitting type laser diode unit is arranged between the reflective optical component and the photodiode unit;
   wherein a first portion of the at least one laser beam is projected on the reflective optical component and then is reflected through the opening of the housing by the reflective optical component, and a second portion of the at least one laser beam is projected on the photodiode unit so as to be detected by the photodiode unit.

2. The surface mount device type laser module according to claim 1, wherein the photodiode unit is disposed outside the base, and the surface mount device type laser module further comprises an optical guide element, wherein the at least a portion of the at least one laser beam is guided by the optical guide element and projected on the photodiode unit.

3. The surface mount device type laser module according to claim 1, further comprising at least one optical element, wherein the edge-emitting type laser diode unit is arranged between the base and at least one optical element, wherein after the first portion of the at least one laser beam is reflected by the reflective optical component, the first portion of the at least one laser beam is optically processed by the at least one optical element.

4. The surface mount device type laser module according to claim 3, wherein a center of the laser beam of the first portion of the at least one laser beam is emitted from a center position of a lighting zone of the edge-emitting type laser diode unit, wherein after the center of the laser beam is projected on the reflective mirror, the center of the laser beam is reflected vertically and propagated in a direction toward an optical center of the at least one optical element.

5. The surface mount device type laser module according to claim 3, wherein the at least one optical element comprises a collimator optical element, wherein after the first portion of the at least one laser beam is reflected by the reflective optical component, the first portion of the at least one laser beam is collimated by the collimator optical element.

6. The surface mount device type laser module according to claim 5, wherein the at least one optical element further comprises a diffractive optical element, wherein after the first portion of the at least one laser beam is transmitted through the collimator optical element, the first portion of the at least one laser beam is shaped by the diffractive optical element and projected out.

7. The surface mount device type laser module according to claim 6, wherein a distance between a first optical axis of the collimator optical element and a second optical axis of the diffractive optical element is smaller than 0.2 mm.

8. The surface mount device type laser module according to claim 5, wherein the collimator optical element has an effective focal length f, wherein $0.5\ mm < f < 3\ mm$.

9. The surface mount device type laser module according to claim 5, wherein the collimator optical element has a numerical aperture N.A., wherein $N.A. < 0.6$.

10. The surface mount device type laser module according to claim 5, wherein the reflective optical component comprises a reflective mirror.

11. The surface mount device type laser module according to claim 6, wherein an angle between a first optical axis of the collimator optical element and a second optical axis of the diffractive optical element is smaller than 2.5 degrees.

12. The surface mount device type laser module according to claim 6, wherein the collimator optical element and the diffractive optical element are connected with each other.

13. The surface mount device type laser module according to claim 3, wherein the at least one optical element is coated with an anti-reflection coating.

14. The surface mount device type laser module according to claim 1, further comprising a second edge-emitting type laser diode unit and a second reflective optical component, wherein the edge-emitting type laser diode unit and the second edge-emitting type laser diode unit provide the at least one laser beam, wherein after the at least one laser beam is reflected by at least one of the reflective optical component and the second reflective optical component, the reflected laser beam is transmitted through the opening of the housing.

15. The surface mount device type laser module according to claim 1, wherein the edge-emitting type laser diode unit comprises plural laser diode chips, wherein the plural laser diode chips provide plural laser beams.

* * * * *